US007355429B2

(12) United States Patent
Jenkins et al.

(10) Patent No.: US 7,355,429 B2

(45) Date of Patent: Apr. 8, 2008

(54) ON-CHIP POWER SUPPLY NOISE DETECTOR

(75) Inventors: Keith A. Jenkins, Sleepy Hollow, NY (US); Anuja Sehgal, Durham, NC (US); Peilin Song, Lagrangeville, NY (US)

(73) Assignee: International Business Machines Corporation, Armonk, NY (US)

(*) Notice: Subject to any disclaimer, the term of this patent is extended or adjusted under 35 U.S.C. 154(b) by 437 days.

(21) Appl. No.: 11/089,215

(22) Filed: Mar. 24, 2005

(65) Prior Publication Data

US 2006/0214672 A1 Sep. 28, 2006

(51) Int. Cl.
*G01R 31/02* (2006.01)

(52) U.S. Cl. ...................................... 324/763; 324/765

(58) Field of Classification Search ............. 324/158.1, 324/760–765; 702/191–193; 327/565; 714/724–733
See application file for complete search history.

(56) References Cited

U.S. PATENT DOCUMENTS 4,331,856 A * 5/1982 D'Antonio ............. 219/121.36
6,823,293 B2 * 11/2004 Chen et al. ................. 702/191
6,842,027 B2 * 1/2005 Liu et al. .................... 324/763

OTHER PUBLICATIONS

H. Aoki et al., "On-Chip Voltage Noise Monitor for Measuring Voltage Bounce in Power Supply Lines Using a Digital Tester," Proceedings of the 2000 International Conference on Microelectronic Test Structures, pp. 112-117, 2000.

A. Muhtaroglu, "On-Die Droop Detector for Analog Sensing of Power Supply Noise," IEEE Journal of Solid-State Circuits, pp. 651-660, vol. 39, No. 4, Apr. 2004.

* cited by examiner

*Primary Examiner*—Vinh P Nguyen
(74) *Attorney, Agent, or Firm*—Anne V. Dougherty; Ryan, Mason & Lewis, LLP

(57) ABSTRACT

Techniques for on-chip detection of integrated circuit power supply noise are disclosed. By way of example, a technique for monitoring a power supply line in an integrated circuit includes the following steps/operations. A first signal and a second signal are preconditioned. The first signal is representative of a voltage of the power supply line being monitored. The second signal is representative of a voltage of a reference power supply line. Preconditioning includes shifting respective levels of the voltages such that the voltages are within an output voltage range of comparator circuitry. Then, the preconditioned first signal and the preconditioned second signal are compared in accordance with the comparator circuitry. Comparison includes detecting when a difference exists between the voltage level of the preconditioned first signal and the voltage level of the preconditioned second signal.

13 Claims, 3 Drawing Sheets

100
OVERSHOOT
UNDERSHOOT
114
112
118
116
INVERTERS
108
110
COMPARATORS
Vnoisy
Vref
104
VDD SENSOR
106
REFERENCE SENSOR
MATCHED VDD-SENSITIVE CIRCUITS
VOLTAGE REFERENCE
REFERENCE GENERATOR
102
Vdd_quiet
R
I
QUIET VDD
VDD

ON-CHIP POWER SUPPLY NOISE DETECTOR

FIELD OF THE INVENTION

The present invention relates generally to integrated circuit power supply noise and, more particularly, to techniques for on-chip detection of integrated circuit power supply noise.

BACKGROUND OF THE INVENTION

Simultaneous switching transistors in densely packed circuits, such as in very large scale integrated (VLSI) circuits, cause current spikes in the power supply lines, which in turn cause voltage noise due to iR and Ldi/dt voltages. Non-invasive off-chip measurements or detection of power supply noise is impractical due to loading effects and tester constraints. However, information about supply fluctuations can be extremely useful for purposes of testing, as well as system reliability improvement.

Some power supply noise detection techniques have been described in H. Aoki et al., "On-chip Voltage Noise Monitor for Measuring Voltage Bounce in Power Supply Lines Using a Digital Tester," Proceedings of the 2000 International Conference on Microelectronic Test Structures, pp. 112-117, 2000; and in A. Muhtaroglu et al., "On-die Droop Detector for Analog Sensing of Power Supply Noise," IEEE Journal of Solid-State Circuits, Vol. 39, Issue 4, pp. 651-660, April 2004, the disclosures of which are incorporated by reference herein.

The technique described in H. Aoki et al. employs a comparator that compares the noisy supply to an external reference voltage. The comparator requires four clocks and the performance of the comparator strongly depends on the time constant of the capacitors in the design. However, the capacitors have to be sized such that the drain-to-gate capacitance of the transistors does not corrupt the measured data. Hence, this technique is extremely sensitive to sizing and does not have any calibration features to offset process and temperature variations. It also does not have any features for generating different reference voltages.

The technique described in A. Muhtaroglu et al. uses voltage sensors connected to the supply lines. It uses a complicated procedure to generate different voltage references. The reference generator requires two 32-bit DACs (digital-to-analog converter) to generate current references. Also, each sensor requires a dedicated current reference, since the calibration features are a function of the current reference (two 32 bit DACs). Also, this approach requires two separate sensors to detect overshoots and undershoots. It also requires two current references to set different thresholds for overshoots and undershoots.

SUMMARY OF THE INVENTION

The present invention provides techniques for on-chip detection of integrated circuit power supply noise. Such inventive techniques overcome the above, as well as other, limitations of existing techniques.

By way of example, in one aspect of the invention, a technique for monitoring a power supply line in an integrated circuit comprises the following steps/operations. A first signal and a second signal are preconditioned. The first signal is representative of a voltage of the power supply line being monitored. The second signal is representative of a voltage of a reference power supply line. Preconditioning comprises shifting respective levels of the voltages such that the voltages are within an input voltage range of comparator circuitry. Then, the preconditioned first signal and the preconditioned second signal are compared in accordance with the comparator circuitry. Comparison comprises detecting when a difference exists between the voltage level of the preconditioned first signal and the voltage level of the preconditioned second signal.

An output signal may be generated when the voltage level of the preconditioned first signal is greater than or less than the voltage level of the preconditioned second signal. The output signal may be representative of an overshoot condition when the voltage level of the preconditioned first signal is greater than the voltage level of the preconditioned second signal. The output signal may be representative of an undershoot condition when the voltage level of the preconditioned first signal is less than the voltage level of the preconditioned second signal. Advantageously, both conditions may be monitored in the same test mode. Also, monitoring may be selectively controllable so as allow for continuous real-time monitoring or for overshoot/undershoot condition testing at a predetermined time for a desired time interval Further, the monitoring technique may also comprise selectively controlling the voltage level of the reference power supply line. Also, the voltage level of the reference power supply line may be generated from a current source.

Accordingly, a detected difference between the voltage level of the preconditioned first signal and the voltage level of the preconditioned second signal is indicative of noise on the power supply line being monitored.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

While illustrative embodiments will be described below in the context of a noisy drain-to-drain voltage (VDD) power supply line, it is to be understood that noise detection principles of the invention are not limited to use with any particular power supply line and thus are more generally applicable for use in detecting power supply line noise in accordance with any suitable integrated circuit architecture.

Figure 1:
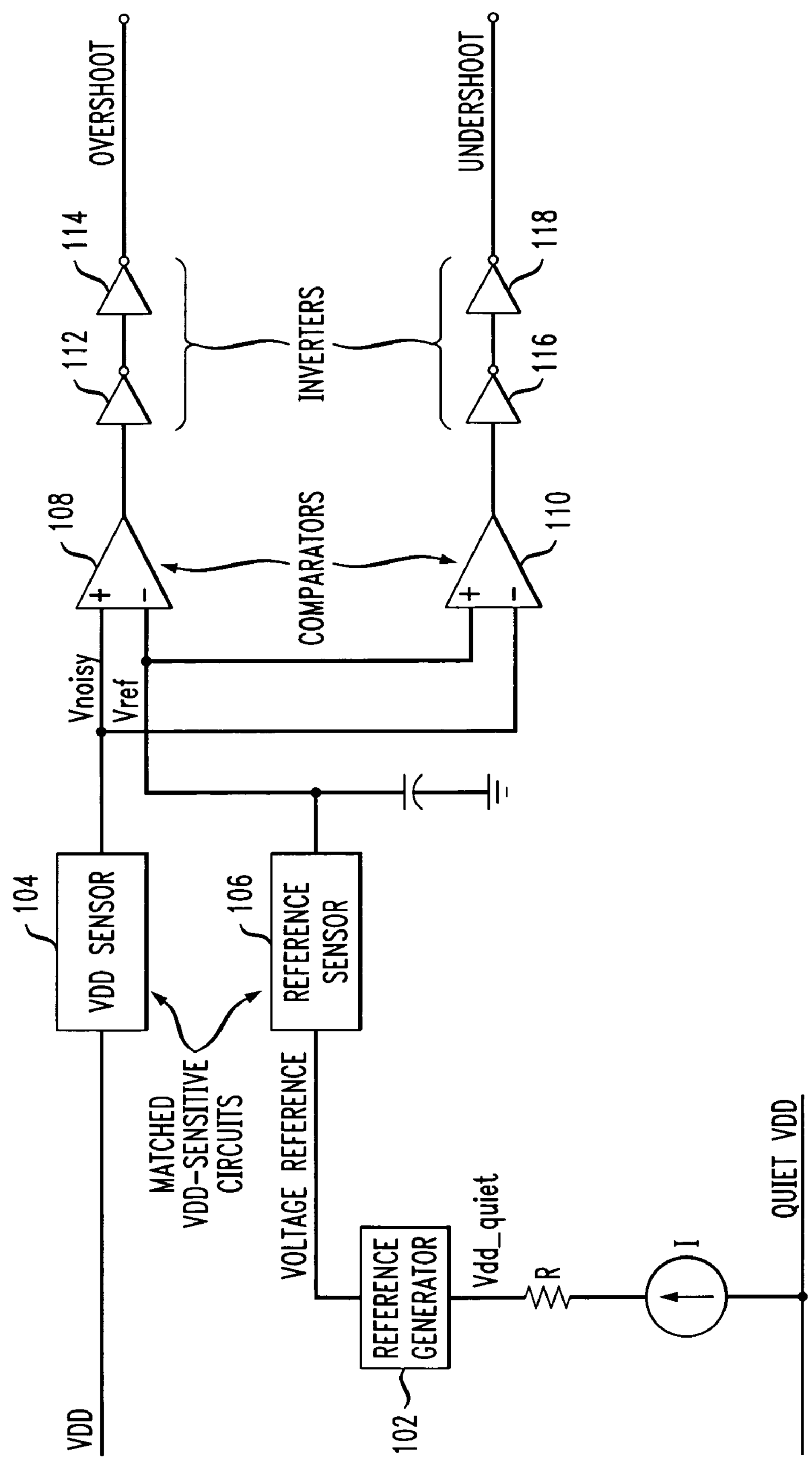
FIG. 1 is a diagram illustrating an on-chip, power supply noise detector, according to an embodiment of the present invention.

FIG. 1 illustrates an on-chip, on-line power supply noise detector, according to an embodiment of the present invention. Power supply noise detector 100 is considered an "on-chip" detector since its components are fabricated on the integrated circuit (i.e., chip) for which the detector will serve to detect noise, i.e., the integrated circuit under test. The detector is also considered an "on-line" or a "real-time"

detector since it continues detecting while the integrated circuit functions in a normal manner.

As shown, detector 100 includes voltage reference generator 102, voltage (VDD) sensor 104, reference sensor 106, dual comparators 108, 110, and two pairs of inverters 112, 114 and 116, 118. One sensor circuit (104) is connected to the noisy VDD supply and the other sensor circuit (106) is connected to a quiet reference supply, i.e., VDD_quiet. The sensors form matched VDD-sensitive circuits.

A quiet voltage supply (i.e., non-noisy or substantially without noise), which may come from an on-chip phase locked loop (PLL) supply or an off-chip supply, is used to generate current reference I, which can be distributed across the entire chip. A current reference is used, since it is easier to distribute current on a chip compared to voltage. This current reference is locally converted into a desired voltage reference by selecting resistors in a resistor divider (which includes R shown in FIG. 1 plus the resistors chosen in FIG. 4 to be described below) which the current source drives. The reference generated from the current source, Vdd_quiet, is then used by voltage reference generator 102 to generate different references. Reference sensor 106 receives its supply voltage from voltage reference generator 102.

The two sensors 104 and 106 precondition the VDD and reference voltages to operate in the input voltage range of the comparators 108, 110. This preconditioning shifts the direct current (DC) level of the waveform to a lower level to enable detection of overshoots and undershoots by the comparator 108 and comparator 110, respectively, since their input swing cannot be greater than the difference of the supply voltages. It is to be understood that the amount of the level shift depends on the reference level set by R. However, the amount of level shift may typically be 10 millivolts or less. Preconditioning only shifts the level, while preserving the voltage transient waveform. The two sensors produce an equal DC level shift in their respective supply voltages at their output (Vnoisy and Vref). In other words, the outputs of the two sensors are their respective supply voltages, DC level shifted by the same amount.

The outputs of the two sensors are compared by the comparators. More particularly, Vnoisy is applied to the positive input of comparator 108 and Vref is applied to the negative input of comparator 108, wherein the positive output signal of comparator 108 represents an overshoot condition. Further, Vnoisy is applied to the negative input of comparator 110 and Vref is applied to the positive input of comparator 110, wherein the positive output signal of comparator 110 represents an undershoot condition.

That is, comparator 108 outputs a logic level high when the VDD sensor output is higher than the reference sensor output, thereby indicating the occurrence of an overshoot. Similarly, comparator 110 outputs a logic level high when the VDD sensor output is lower than the reference sensor output, thereby indicating the occurrence of an undershoot. The use of two comparators allows the simultaneous detection of overshoots and undershoots during the same test mode.

When both inputs of the comparators are equal, the output is a deterministic voltage below the threshold of an inverter. Two inverters (112, 114 and 116, 118) are used at the output of each comparator so that they produce a logic level zero when the two inputs of each comparator are equal. As a result, a logic level one is produced only in the event of an overshoot condition or an undershoot condition.

Further, the comparators and the inverters can use the same VDD supply as is being sensed, since the logic levels will not be disturbed by the supply overshoots and undershoots, and since the fluctuations will not exceed the switching thresholds of the comparators and the inverters.

Still further, since the sensor circuits are matched, very small (e.g., the entire circuit may be 50 micrometers by 100 micrometers, less than 0.005 percent of the area of a typical VLSI circuit), and placed next to each other, performance variations that may occur due to process or temperature variation are minimized, unlike with existing techniques. Also, it is possible to detect undershoots and overshoots and set different thresholds for overshoot and undershoot detection by replicating only one of the matched sensor circuits and comparators.

Figure 3:
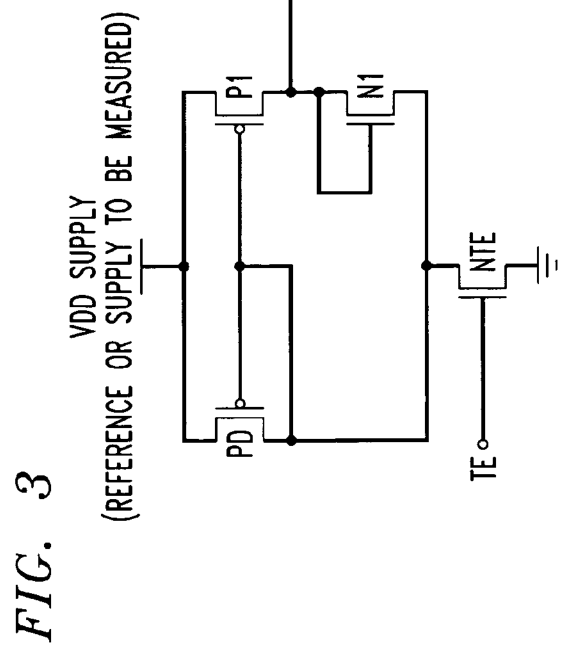
FIG. 3 is a diagram illustrating a voltage sensor, according to an embodiment of the present invention.

The sensor circuits also may have an enable function to turn them off when desired (shown in FIG. 3 where TE equal to a logic one means the sensor is on, and TE equal to logic zero means the sensor is off.). This allows them to work continuously in real time, as for example, in monitoring the voltage fluctuation, or to make measurements at some time determined by other means, for example, after a compute operation commences. The current mirror sensor has a very high bandwidth (e.g., about 1 GHz), and so the bandwidth of the measurement is determined by the comparator circuit. The enable feature can thereby be used in conjunction with variable reference levels, as described below, to generate a sampled voltage waveform.

Figure 2:
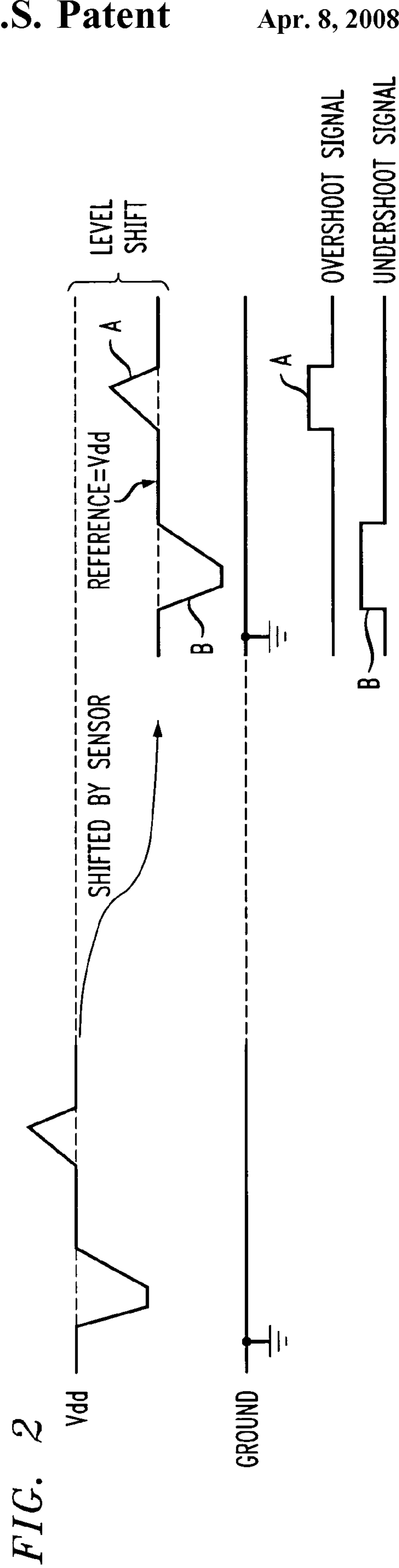
FIG. 2 is a diagram illustrating power supply noise level shifting and overshoot/undershoot conditions, according to an embodiment of the present invention.

FIG. 2 illustrates power supply noise level shifting and overshoot/undershoot conditions, according to an embodiment of the present invention. More particularly, FIG. 2 illustrates the function of the sensors and comparators when the VDD supply has both overshoots and undershoots. By level shifting the voltages, as compared to ground level, the comparators do not need a separate power supply, as they can operate from the same system VDD. Further, as shown, the overshoot signal is at a logic level one when there is an overshoot condition (VDD greater than reference voltage). This correspondence is denoted in FIG. 2 with reference letter A. Likewise, the undershoot signal is at a logic level one when there is an undershoot condition (VDD less than reference voltage). This correspondence is denoted in FIG. 2 with reference letter B.

FIG. 3 illustrates a voltage sensor, according to an embodiment of the present invention. More particularly, FIG. 3 shows a sensor circuit topology that may be employed in VDD sensor 104 and reference sensor 106. Thus, the two sensors are a matched pair.

As shown, each sensor includes four transistors, i.e., p-type field effect transistors (pFETs) PD and P1 and n-type field effect transistors (nFETs) NTE and N1. The nFET NTE is an enabling transistor used to turn the sensors on and off. When the test enable input TE is high, the sensor is in an ON state. When the test enable input is low, the sensor is in an OFF state. The pFET P1 mirrors the current in the diode-connected pFET PD. The pFET P1 and nFET N1 act as a voltage divider to shift the DC output level at point Vout. The ratio of sizes of the nFET N1 and pFET P1 control the amount of DC level shift. Thus, the sensors can be designed to output different DC level shifts, depending on the input swing of the comparator. The fluctuations in the VDD supply of the noisy sensor causes the current in the diode-connected pFET to fluctuate proportionally. These current fluctuations together with the DC level shift are seen at the output. The output of the reference sensor is the reference voltage with the same DC level shift as that of the VDD sensor.

Advantageously, the test enable input (TE) allows for selection of continuous real-time monitoring or testing for overshoot/undershoot conditions at a predetermined time for a desired time interval.

Figure 4:
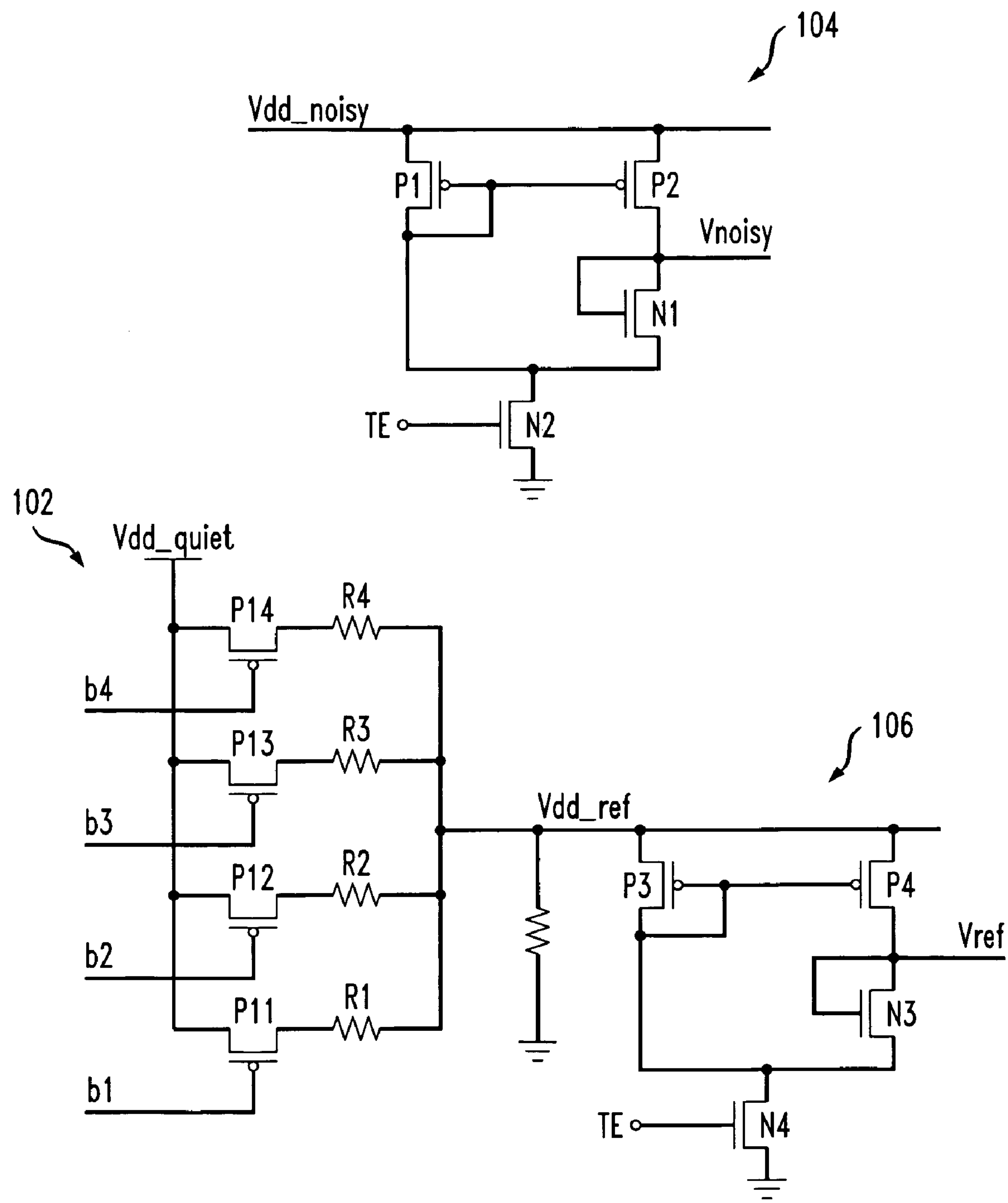
FIG. 4 is a diagram illustrating a reference voltage generator, according to an embodiment of the present invention.

FIG. 4 illustrates a reference voltage generator (e.g. reference generator 102 of FIG. 1), according to an embodiment of the present invention. Also shown in FIG. 4, in relation to reference generator 102, are reference sensor 106 and VDD sensor 104. The two sensors are both configured as shown and explained in the context of FIG. 3 (VDD sensor including FETs P1, P2, N1 and N2 and reference sensor including FETs P3, P4, N3 and N4).

By adding resistors of different values in parallel, it is possible to generate voltage references of different values. These voltage references provide voltage supplies for the reference sensor 106. The resolution of voltage reference generation is governed by the number of resistors used. As shown, passgates P11 through P14 are used to select resistors R1 through R4, respectively.

It is to be understood that a decoder or an internal state machine can be used to minimize the number of inputs (b1 through b4) required for reference generation. Calibration of the reference levels can be performed by ramping VDD over the appropriate range while the surrounding noisy circuit is disabled, and observing the switching of the comparator states.

The entire control of the detector, including setting of the reference levels, is controlled by digital input signals, and the entire output of the detector results in digital output signals. Thus, no analog input or output signals are required for operation of the detector circuit.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. Apparatus for monitoring a power supply line in an integrated circuit, comprising:

sensor circuitry, the sensor circuitry preconditioning a first signal and a second signal, the first signal being representative of a voltage of the power supply line being monitored, the second signal being representative of a voltage of a reference power supply line, the preconditioning operation comprising shifting respective levels of the voltages such that the voltages are within an input voltage range of comparator circuitry; and comparator circuitry coupled to the sensor circuitry, the comparator circuitry comparing the preconditioned first signal and the preconditioned second signal, the comparing operation detecting when a difference exists between the voltage level of the preconditioned first signal and the voltage level of the preconditioned second signal;

wherein the sensor circuitry comprises a pair of matched sensors, wherein the pair of matched sensors comprise a first sensor for preconditioning the first signal and a second sensor for preconditioning the second signal;

wherein the first sensor is configured such that the preconditioned first signal output by the first sensor is responsive to a fluctuation in the voltage of the power supply line being monitored.

2. The apparatus of claim 1, wherein an output signal is generated by the comparator circuitry when the voltage level of the preconditioned first signal is greater than or less than the voltage level of the preconditioned second signal.

3. The apparatus of claim 2, wherein the output signal represents an overshoot condition when the voltage level of the preconditioned first signal is greater than the voltage level of the preconditioned second signal.

4. The apparatus of claim 2, wherein the output signal represents an undershoot condition when the voltage level of the preconditioned first signal is less than the voltage level of the preconditioned second signal.

5. The apparatus of claim 1, further comprising a reference generator coupled to at least a portion of the sensor circuitry, the reference generator selectively controlling the voltage level of the reference power supply line.

6. The apparatus of claim 5, wherein the reference generator is driven by a current source.

7. The apparatus of claim 1, wherein a detected difference between the voltage level of the preconditioned first signal and the voltage level of the preconditioned second signal is indicative of noise on the power supply line being monitored.

8. The apparatus of claim 1, wherein the comparator circuitry comprises a pair of comparators, wherein the pair of comparators comprise a first comparator coupled to the first sensor and a second comparator coupled to the second sensor.

9. The apparatus of claim 8, further comprising a first pair of inverters coupled to the first comparator and a second pair of inverters coupled to the second comparator.

10. The apparatus of claim 9, wherein the first and second comparator and the first and second pair of inverters are supplied by the power supply line being monitored.

11. The apparatus of claim 1, wherein the sensor circuitry is configured such that monitoring of the power supply line is selectively controllable.

12. The apparatus of claim 11, wherein selective control of the monitoring allows for continuous real-time monitoring or for overshoot/undershoot condition testing at a predetermined time for a desired time interval.

13. In an integrated circuit, circuitry for detecting noise associated with a power supply line, comprising:

a pair of sensors, the pair of sensors preconditioning a first signal and a second signal, the first signal being representative of a voltage of the power supply line on which noise is to be detected, the second signal being representative of a voltage of a reference power supply line, the preconditioning operation comprising shifting respective levels of the voltages such that the voltages are within an input voltage range of a pair of comparators;

a pair of comparators respectively coupled to the pair of sensors, the pair of comparators comparing the preconditioned first signal and the preconditioned second signal, the comparing operation detecting when a difference exists between the voltage level of the preconditioned first signal and the voltage level of the preconditioned second signal; and a pair of inverter circuits respectively coupled to the pair of comparators, the pair of inverter circuits outputting an overshoot signal when the voltage level of the preconditioned first signal is greater than the voltage level of the preconditioned second signal and an undershoot signal when the voltage level of the preconditioned first signal is less than the voltage level of the preconditioned second signal.

* * * * *